United States Patent [19]

Monk

[11] 4,187,801
[45] Feb. 12, 1980

[54] METHOD AND APPARATUS FOR TRANSPORTING WORKPIECES

[75] Inventor: Gaines W. Monk, Alexandria, Va.

[73] Assignee: Commonwealth Scientific Corporation, Alexandria, Va.

[21] Appl. No.: 859,965

[22] Filed: Dec. 12, 1977

[51] Int. Cl.² ............................................. C23C 11/00
[52] U.S. Cl. .................................. 118/729; 118/500; 198/802; 427/248 G
[58] Field of Search ....................... 198/377, 344, 802; 118/322, 69, 500, 49, 49.1, 48, 49.5; 427/248 G; 156/640; 315/111, 8; 134/70, 72, 131, 126, 161

[56] References Cited

U.S. PATENT DOCUMENTS

| | | | |
|---|---|---|---|
| 2,435,997 | 2/1948 | Bennett | 118/49 |
| 2,864,281 | 12/1958 | Draper | 198/377 X |
| 3,782,325 | 1/1974 | Farnsworth et al. | 118/322 X |
| 3,785,853 | 1/1974 | Kirkman et al. | 198/344 X |
| 3,983,838 | 10/1976 | Christensen | 118/500 X |

Primary Examiner—John P. McIntosh
Attorney, Agent, or Firm—Cushman, Darby & Cushman

[57] ABSTRACT

A method and apparatus for transporting workpieces during surface altering treatment in which each workpiece is mounted on a holder which moves along a guide slot forming a non-circular, closed path. A double sprocket chain extending along one side of the slot engages a gear of each workholder for moving the holders along the slot as the double chain is driven. A second chain on the other side of the slot also engages the gear to rotate the holders as they move along the slot. Links connect the holders and cover the portions of the slot not covered by the upper surfaces of the holders on which the workpieces rest. The workpieces are thus uniformly treated, for example, coated.

14 Claims, 4 Drawing Figures

METHOD AND APPARATUS FOR TRANSPORTING WORKPIECES

BRIEF DESCRIPTION OF THE BACKGROUND AND SUMMARY OF THE INVENTION

The invention relates to a method and apparatus for transporting workpieces during treatment.

In many processes where identical samples must be treated, e.g., by coating, spraying, etching, ion-implantation, etc., uniform treatment of each sample and across each sample is important. Generally, the source of treatment, e.g., the spray, evaporation source, or ion beam, is not perfectly uniform in intensity across its area of treatment, and to achieve uniform results either the source of the samples must be moved relative to each other during treatment. Further, in order to make sure that each sample is treated identically, it is conventional to treat a larger area than over which the samples move relative to the source and thus avoid "edge effects". This treatment of area not containing samples is very inefficient and can waste valuable treating material. A similar or greater efficiency is created if the source is held fixed and the samples move sequentially with respect to the source. The ideal system would be one which utilizes all of the spray or beam from the source and rearranges the sample array to achieve uniformity.

High efficiency is particularly important in processes using valuable products in expensive operations, such as the coating in vacuum of integrated circuit wafers with gold and other valuable material. In such treatments, typical wafers are two to three inches in diameter and 0.020 inches thick. They are coated in a vacuum chamber eight to thirty-six inches in diameter by means of a beam of gold molecules evaporated from a hot source.

Various devices have been developed for improving the uniformity of the twenty to one hundred wafers which are usually processed in each batch in treatments of this type. All such techniques are compromises in that the wafer does not duplicate the motion of every other wafer unless much of the beam is wasted. For example, devices in the prior art have been sold in which workpiece holders are moved in planetary or epicycloid rotation along a circular path. Devices are also sold in which holders mounted on a plate rotate while the plate itself is rotated about another axis. One difficulty is that some planets have a different exposure from other planets and thus uniformity is not assured. Gears have been utilized to drive the individual workpiece holders.

The present invention relates to a method and apparatus for resolving many of the problems which have existed in transporting workpieces as described above. According to the present invention, each of the workpieces is mounted on a holder and the holder moved along a guide slot forming a closed, non-circular path which covers substantially all of the surface altering treatment area, generally the area on which the beam is incident. The path thus necessarily is not a single straight line. The path can consist of straight line and curved segments which almost entirely fill any desired space, e.g., a rectangular area. Since the path is closed, each of the workpieces is subjected to the same identical treatment.

More particularly, in the embodiment described in detail below, a double sprocket chain is mounted along one side of the slot, while a fixed chain is mounted along the other side. The double sprocket chain is driven through a gear by a motor to cause movement of each of the individual workpieces which engage the respective first and second chains. Since the second chain is fixed or moves at a differential rate with regard to the double sprocket chain, the workpiece holders which mount the workpieces on the upper surfaces thereof also rotate during movement along the closed path. The workpiece holders are connected together by links which cover the slot portions not covered by the upper surfaces of the workpiece holders and the workpieces themselves. Cooling lines can be provided, e.g., below the base forming the bottom of the slot, and extending along the path of the slot to cool as necessary the workpiece holders and workpieces.

Many other objects and purposes of the invention will be clear from the following detailed description of the drawings.

DETAILED DESCRIPTION OF THE DRAWINGS

Figure 1:
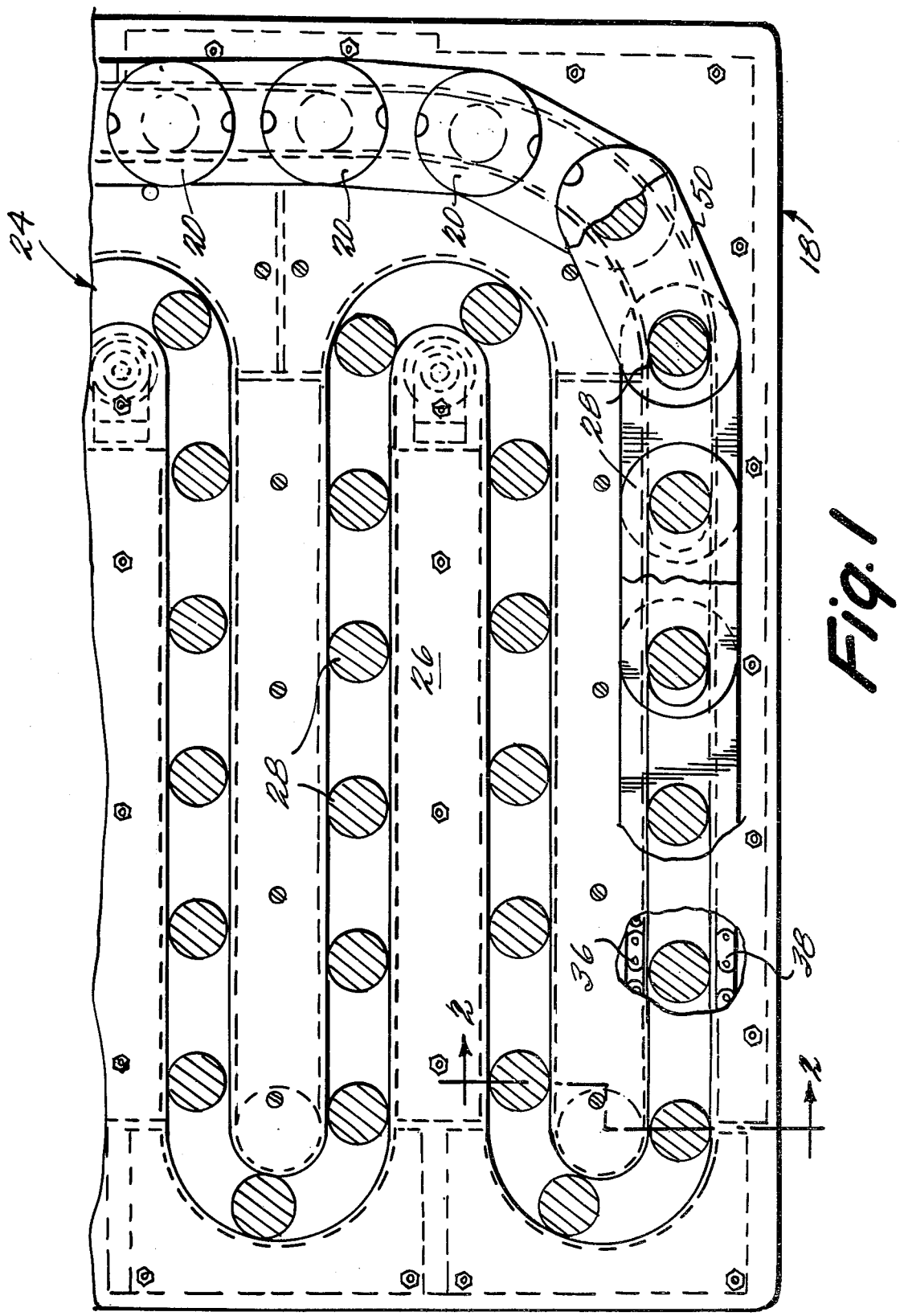
FIG. 1 shows a top plan view of one embodiment of the present invention, showing a portion of the closed non-circular path with several workpiece holders and workpieces mounted for movement along the path. Parts of the view have been cut away to show the links which cover the slot and the chains which extend on either side of the slot.
Figure 2:
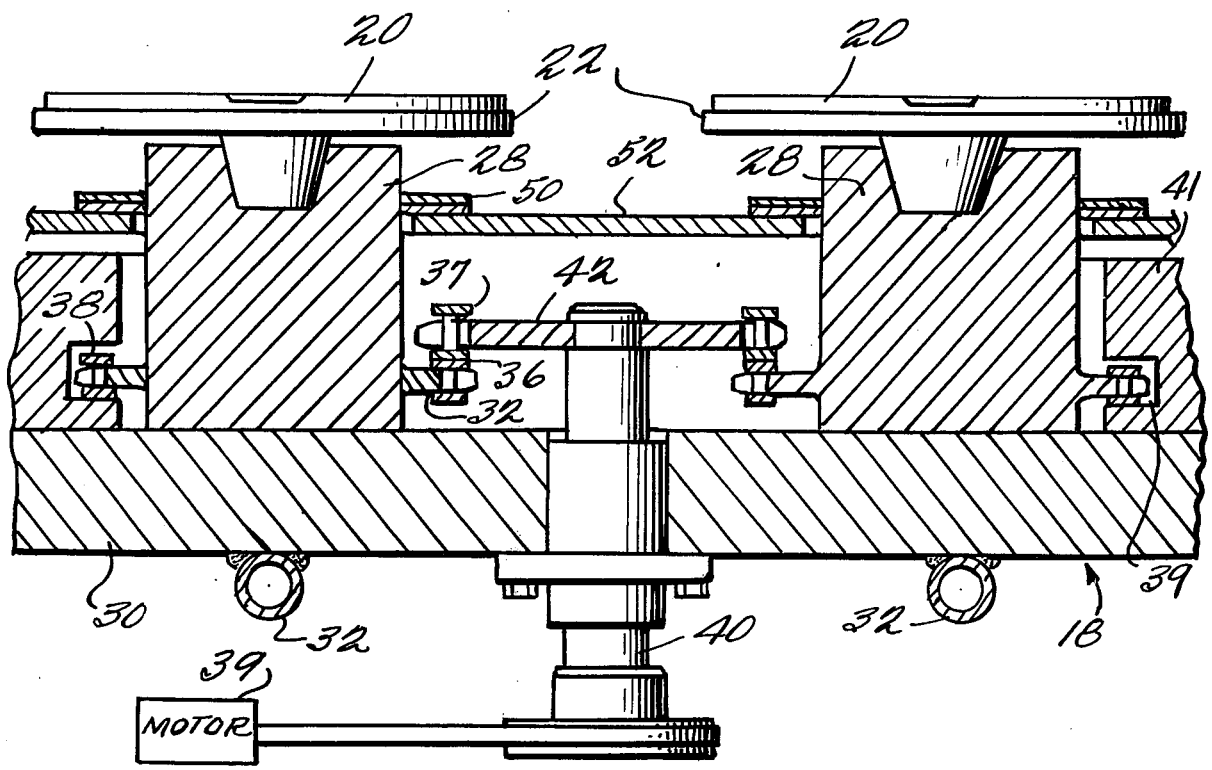
FIG. 2 shows a sectional view of the embodiment of FIG. 1 along the lines 2—2.
Figure 4:
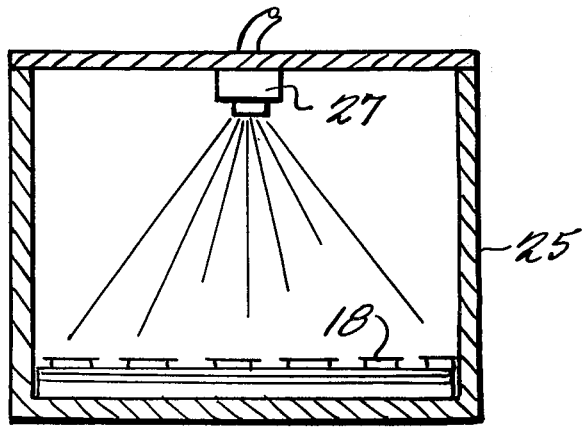
FIG. 4 shows a schematic view of an apparatus for treating workpieces, incorporating a transporting embodiment as illustrated in FIGS. 1-3.
Figure 3:
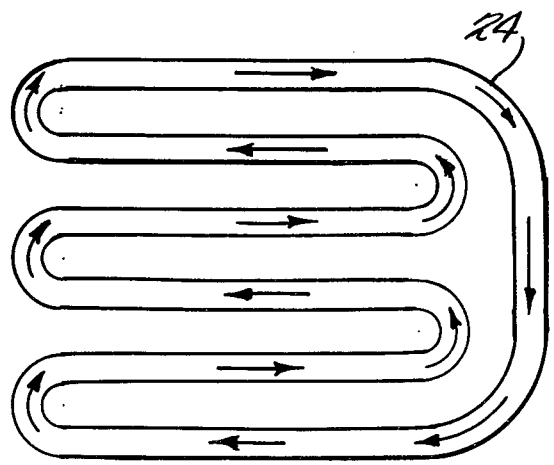
FIG. 3 shows a schematic view of the path covered by the embodiment of FIG. 1.

Reference is now made to FIGS. 1 and 2 which show a first embodiment of the workpiece transporter 18 of the present invention. According to the embodiment of FIGS. 1-3, a plurality of samples, one being indicated by sample 20 in FIG. 2, are mounted on the upper surfaces of platens 22 of a number of workpiece holders which are in turn mounted for movement along guide slot 24 defining an endless path of the shape shown schematically in FIG. 3. In this embodiment, the path forms a nearly rectangular array and the workpieces are moved at a speed high enough so that each wafer is cycled many times during processing. Each of the workpieces is thus treated identically. The processing takes place in a container 25, as shown schematically in FIG. 4, where the workpieces are treated from a beam from source 27 which alters the surface, typically by adding or subtracting therefrom.

Each workpiece holder is formed with a platen 22 defining an upper surface upon which at least one sample 20 rests and a spool 28 sliding in the bottom of slot 24. The platens simply rest on the spools and can be replaced as desired. The bottom of the slot is defined by a copper base 30 along which the holders slide on lubricant or the like. Ball bearings can be used to aid movement of the holders if desired. Water line 32 extends below base 30 following the contour of slot 24 so that water or other suitable coolant can be pumped through line 32 to cool the workpiece holders and the workpieces mounted on the upper surfaces thereof. Temperature control may not be necessary for all applications.

Each workpiece holder further includes a gear 32 mounted on portion 28, which gear engages the double chain 36 extending on one side of slot 24 and the single chain 38 extending on the other side.

One sprocket 37 of double chain 36 is driven by a motor 39 via connecting shaft 40 and gear 42. Chain 38 slides in a groove 39 in a chain guide plate 41. If necessary chain 38 can be held in groove 39 by suitable lips. Chain 36 is held in a similar groove (not seen in FIG. 2). Referring to FIG. 1, such driving mechanisms as shown in FIG. 2 are preferably provided for at least one of the U-shaped corners and freely rotatable sprocket gears at the other locations. Several driving mechanisms can be provided and the drive conventionally synchronized.

In order to cover and fully protect the slot from a treatment beam or the like, a plurality of links 50 as shown in FIG. 1 connect together the respective holders and cover the portions of the slot not covered by shield plate 52 and the upper surfaces of holder 22 and the samples thereon. Each of the links 50 includes holes at either end through which the portions 28 pass. The holes are slightly larger than the diameters of the portion to permit the holders to round the curves. These links are preferably formed of stainless steel, titanium or any other suitable metal.

Chain 38 can be fixed or can be driven at a differential rate with regard to the double chain 36. Thus, the speed of rotation with regard to the speed of movement of the workpiece holders can be adjusted as desired.

The array illustrated was tested with forty-four two-inch diameter integrated circuit wafers etched in an ion beam. The non-uniformity across each wafer and between wafers was less than could be measured, about 1%. The beam continuously fell on the array which was larger in extent than the roughly circular beam of ions. Thus, the loss of efficiency was due only to part of the beam's falling between the round samples.

The present invention finds particular utility in the treatment of wafers as described. However, it can also be used in any situation where materials must be handled during treatment which alters a workpiece surface. Further, the present transportation device can be used in three-dimensional transportation, e.g., on the interior surface of a sphere to keep a fixed distance from the source.

Many changes and modifications in the above described embodiments of the invention can, of course, be carried out without departing from the scope thereof, and accordingly that scope is intended to be limited only by the scope of the appended claims.

What is claimed is:

1. An apparatus for transporting workpieces along a closed, non-circular path in a treatment chamber for treatment which alters a surface of the workpieces, comprising:
    a plurality of workholders for each mounting at least one workpiece;
    means defining said closed non-circular path for guiding movement of said workholders along said path including a base plate along which said workholders slide in direct contact with said plate for effective heat transfer;
    means for controlling the temperature of said base plate; and
    means for engaging said workholders to drive said workholders along said path and rotating each of said workholders about its axis during movement along said path so that all of the workpieces follow the same path and are treated identically.

2. An apparatus as in claim 1, wherein said guiding means defines a slot forming said path.

3. An apparatus as in claim 2, wherein said engaging means includes a first chain extending along one side of said slot and a second chain extending along the other side of said slot, said workholders each including a gear for engaging said first and second chains and said engaging means including means for driving said first chain.

4. An apparatus as in claim 3, wherein said first chain is a double sprocket chain.

5. An apparatus as in claim 4, wherein said first chain driving means includes a further gear engaging said first chain, a motor and means for coupling said motor to said further gear for driving said further gear and said first chain.

6. An apparatus as in claim 2, wherein each said holder includes a platen having an upper surface for receiving a workpiece, and a spool having a cross-sectional area less than the area of said upper surface.

7. An apparatus as in claim 6, further including a plurality of flat links each having an aperture at opposite ends through which one of said spools passes, said links covering the parts of said slot not covered by said upper surfaces.

8. An apparatus as in claim 1, including means for coating the workpieces on said workholders.

9. An apparatus as in claim 1, wherein said controlling means includes a cooling line extending along said slot below said base plate.

10. An apparatus as in claim 9, wherein the encompassed area is rectangular.

11. An apparatus as in claim 1, wherein said path carries said workpiece over substantially all of the area encompassed by said path.

12. An apparatus as in claim 1, wherein said path has straight line and curved segments.

13. A method of transporting workpieces during treatment which alters a surface of the workpieces, comprising:
    mounting at least one workpiece on each of a plurality of workholders connected together for movement along a closed non-circular path;
    moving said workholders along said path while sliding on a base plate in direct contact therewith for effective heat transfer;
    rotating each of said workholders about its axis during movement along said path; and
    controlling the temperature of said base plate.

14. A method as in claim 13, wherein each of said holders engage first and second chains extending along opposite sides of said path and said steps of rotating and moving include driving one of said chains with respect to the other of said chains.

* * * * *